United States Patent [19]

Wright et al.

[11] Patent Number: 4,736,517
[45] Date of Patent: Apr. 12, 1988

[54] SIDE BY SIDE DIP SOCKET INSERTION DEVICE

[75] Inventors: Henry Wright, Ipswich; Peter Kittredge, Everett, both of Mass.

[73] Assignee: USM Corporation, Farmington, Conn.

[21] Appl. No.: 901,104

[22] Filed: Aug. 28, 1986

[51] Int. Cl.4 .............................................. H05K 13/04
[52] U.S. Cl. ...................................... 29/741; 29/743; 29/837
[58] Field of Search .................. 29/741, 743, 739, 837

[56] References Cited

U.S. PATENT DOCUMENTS 4,586,251 5/1986 Kinoshita et al. .................... 29/741
4,593,820 6/1986 Antonie et al. .................... 29/741 X Primary Examiner—Howard N. Goldberg
Assistant Examiner—Taylor J. Ross
Attorney, Agent, or Firm—Spencer T. Smith

[57] ABSTRACT

Mechanism associated with the insertion head of an electrical component insertion machine permitting the head to be adjusted from normal IC insertion to side by side socket insertion.

4 Claims, 3 Drawing Sheets

POSITION 1

POSITION 2

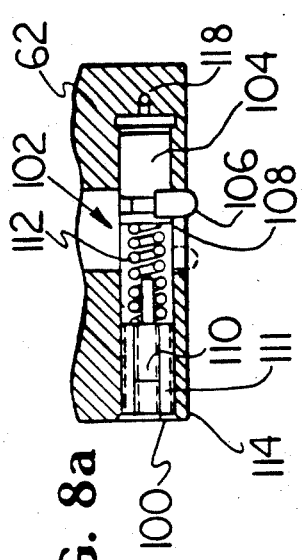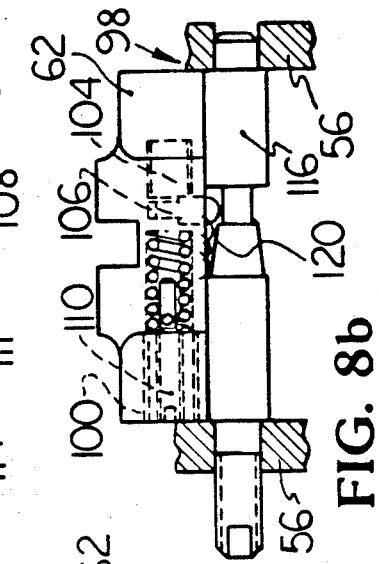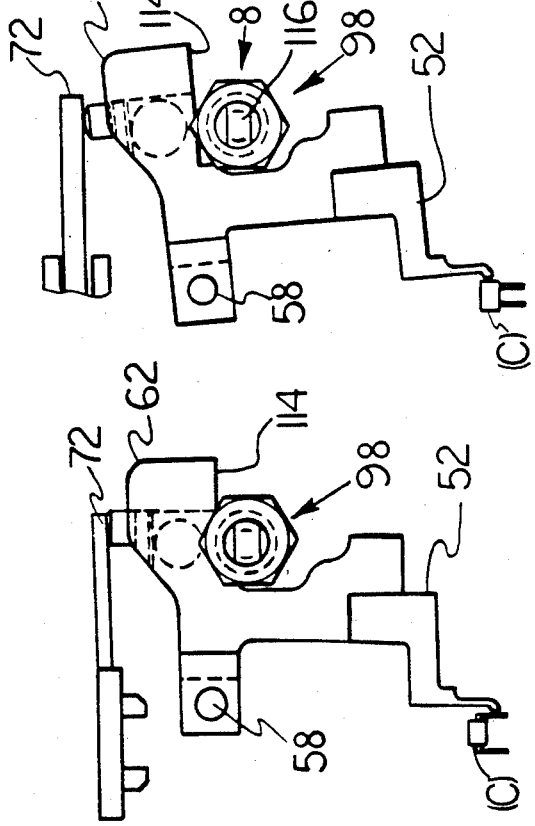

SIDE BY SIDE DIP SOCKET INSERTION DEVICE

BACKGROUND OF THE INVENTION

1. Field of the Invention

It is the purpose of this invention to provide mechanisms which permit the insertion head of an electrical component assembly machine to be changed from normal IC insertion to insertion of side by side sockets.

2. Summary of the Prior Art

In machines for automatically inserting electrical components into printed circuit boards, the components are transported from a source to an insertion head which positions the component leads down through predetermined openings in the board. Thereafter, a cut-clinch unit located below the board severs off excess lead length and bends or crimps the leads over to mechanically lock the component to the board. Illustrations of machines of this type are shown in commonly owned U.S. Pat. Nos. 4,161,064 and 4,387,506.

In machines of this type, it is desirable in certain applications to be able to also insert sockets in a side by side relation with minimal spacing therebetween to maximize the number of sockets that can be placed on a given board.

SUMMARY OF THE INVENTION

It is the purpose of this invention to provide for side by side DIP socket insertion into a printed circuit board.

It is an object of this invention to provide for the insertion fingers of a socket insertion head to grip the sides of the socket to permit a socket to be inserted into a board and placed closely adjacent to a previously inserted socket.

It is also an object of this invention to provide for an insertion head that can be changed from normal IC insertion to side by side socket insertion and parts insertion thereafter into the socket.

BRIEF DESCRIPTION OF THE DRAWING

FIGS. 8a and 8b are illustrations of the adjustable finger closed stop, taken in the direction of arrow 8 in FIG. 9b; and FIGS. 9a and 9b are illustrations of the finger position during normal IC insertion and the position during side by side socket insertion.

DESCRIPTION OF THE PREFERRED EMBODIMENT

Figure 1:
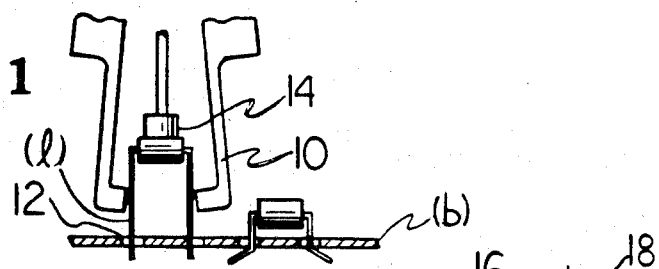
FIG. 1 is an illustration of the position of the insertion fingers during normal IC insertion.

In the art of automatically inserting components, it has been a conventional practice, at the insertion station, to have a pair of opposed fingers that grip the leads under the component body and position the leads above the openings in the board. Thereafter, the fingers are released and a pusher forces the component toward the top surface of the board. This type of normal IC inserting is illustrated in FIG. 1 wherein the fingers 10 have positioned the component leads (1) into the openings 12 in the board (b). Thereafter, the fingers 10 would be released and a pusher 14 would move the component (c) toward the board. When inserting sockets, however, it is desirable to position the sockets side by side with a minimum of clearance. This requires that the fingers 10 be above the previously inserted socket.

Figure 2A:
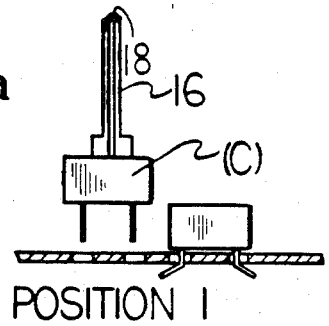
FIGS. 2a and 2b are an illustration of one manner of handling sockets permitting side by side socket insertion.
Figure 2B:
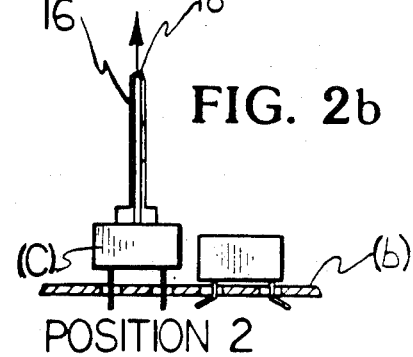
Figure 3:
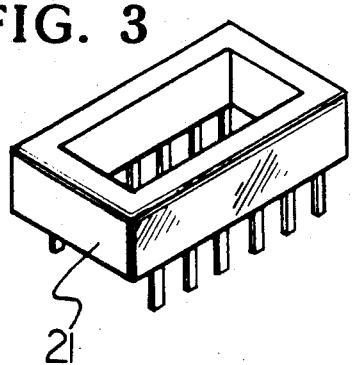
FIG. 3 is an illustration of one type of socket.

One manner of handling the sockets to accomplish this objective is illustrated in FIGS. 2a and 2b wherein a vacuum is supplied to the pusher so that the socket can be held by the pusher. As illustrated in FIG. 2a, the pusher 16 has an opening 18 to which vacuum is applied between position 1 and position 2 so that the socket (s) can be held by the pusher 16. This permits the sockets to be positioned closer together. The disadvantage to this arrangement is that open sockets, such as socket 21 illustrated in FIG. 3, cannot be handled by the vacuum on the pusher.

Figure 4:
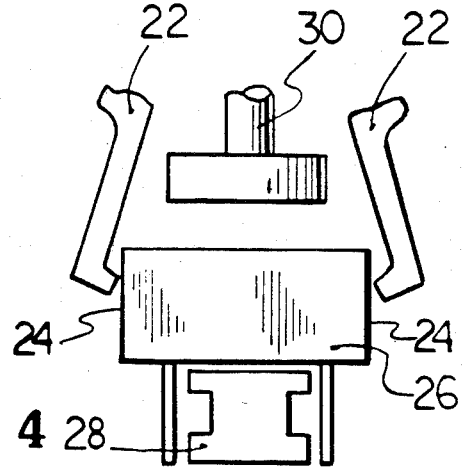
FIGS. 4 and 5 are illustrations of the manner of handling sockets of this invention permitting side by side socket insertion.
Figure 5:
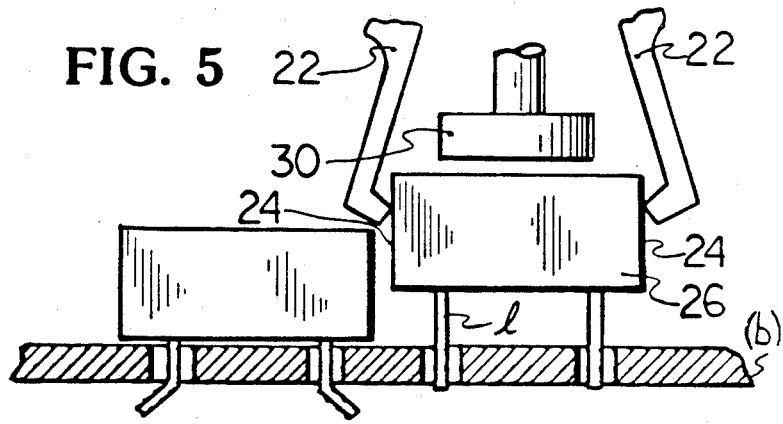

Attention is now directed to FIGS. 4 and 5 which illustrate the manner of handling any type of socket so that the sockets can be positioned side by side. In this arrangement, the fingers 22 grip the sides 24 of the socket 26 and the transfer mandrel 28 is withdrawn. With a downward movement of the head, the socket 26 can be positioned adjacent another socket with the fingers above the surface of a previously inserted socket and with the leads (1) slightly through the openings in the board (b). The fingers 22 can then be opened and the downward stroke of the pusher 30 will finish inserting the component into the board (b).

Figure 6:
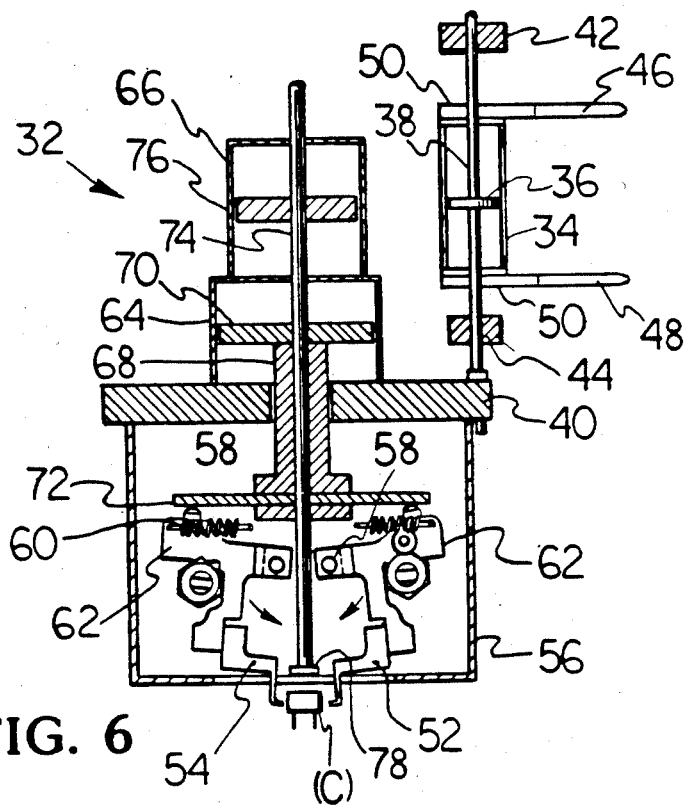
FIG. 6 is a diagrammatic illustration of the insertion head.

Attention is now directed to FIG. 6 which diagrammatically illustrates an insertion head 32 which comprises a head cylinder 34 carried on the machine frame. The piston 36 in cylinder 34 has a piston rod 38 carrying the head casting 40. Upper and lower stop collars 42,44 limit the upper and lower travel of the piston rod 38 and thus the head casting 40. Upper and lower slides 46, 48 are inserted between the stop collars and the end caps 50 of the head cylinder to limited the travel of the head casting (and thus fingers 52,54) as will become apparent hereinafter.

Mounted to the head casting 40 is a downwardly extending plate 56 to which he fingers 52,54 are pivoted at 58. The fingers 52,54 are normally biased open by the springs 60 attached between the upper ends 62 of the fingers and the plate 56. Mounted above the head casting 40 are the finger operating cylinder 64 and the pusher operating cylinder 66. The rod 68 on piston 70 of the finger cylinder 64 carries a plate 72 contacting the upper ends 62 of fingers 52,54. Downward movement of the piston 70 will cause the fingers to pivot about point 58 and close. Passing through the rod 68 is the rod 74 of the piston 76 of the pusher cylinder 66. Downward movement of the rod 74 will cause the pusher 78 to force the component to the board.

Figure 7A:
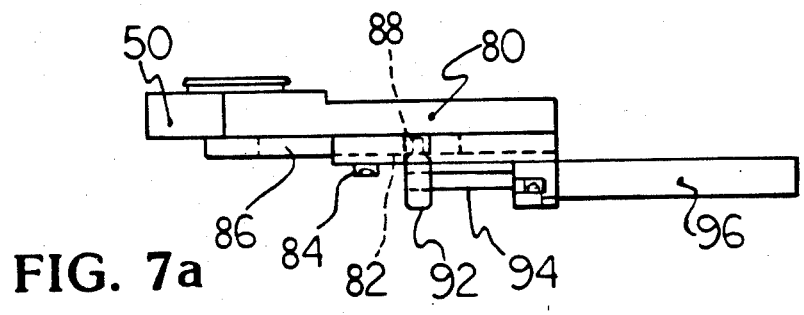
FIGS. 7a and 7b are illustrations of the spacers permitting insertion head height adjustment.
Figure 7B:
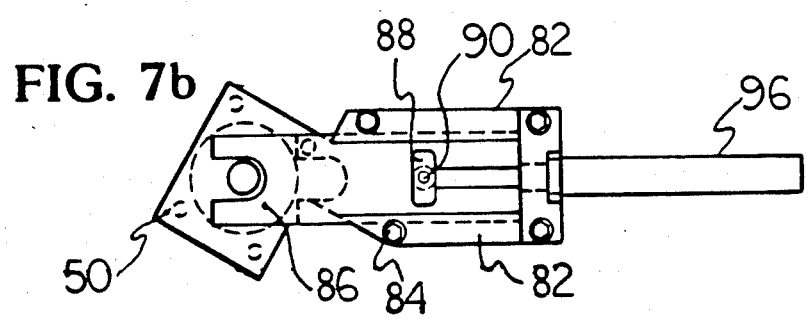

Reference is now made to FIGS. 7a and 7b which illustrate the details of the slides 46 and 48. The slides 46 and 48 are similar and each comprise a plate 80 which is part of end cap 50 to which a pair of channels 82 are secured by bolts 84. A spacer 86 is positioned in the channels 82 and has a hole 88 receiving a pin 90 attached to a collar 92 on the end of rod 94 of cylinder 96. The cylinder 96 will move the spacer 86 in or out between the end cap 50 and the stop collars 42,44 to control the up an down position of the insertion head, as will become apparent hereinafter.

Attention is now directed to FIGS. 8a and 8b which illustrate the details of the finger closed stop 98 (only one is shown, however, each finger has a stop 98 associated therewith). The upper ends 62 of fingers 52,54 contain a cylindrical opening 100 containing the finger closed positioning mechanism 102. The mechanism 102 comprises a piston 104 having a press fit stop pin 106 riding in slot 108 in the end 62 of the finger. An adjustable piston stop 110 is threaded into threaded insert 111 in opening 100. A spring 112 is positioned between the threaded insert 111 and piston 104.

In normal IC insertion, the edge 114 of the upper end 62 of the finger stops on the finger stop 116 carried in the plate 56 (see FIG. 6). This will result in the finger closed position illustrated in FIG. 9a. At this time, the spacer 86 of slider 48 is in the "in" position between the stop collar 44 and end cap 50 limiting the upward travel of the insertion head to position the fingers into the leads of the component (see FIG. 9a) to remove the component from the transfer mandrel. Also, during normal IC insertion, the slider 46 would be at the "out" position permitting the head to travel the full downward stroke to bring the IC to the board.

When, however, it is desirable to insert sockets, i.e., raise the head position and move the fingers out at the finger closed position so the fingers grab the sides of the sockets, the following will occur. The spacer 86 of slider 48 will be removed from between the stop collar 44 and end cap 50 so that in the up position, the fingers will grab the sides of the sockets with the sockets on the transfer mandrel. Air into the port 118 of opening 100 will move the piston 104 (to the left in FIGS. 8a and 8b) against the bias of spring 112 to contact the stop 110. When the fingers close, the pin 106 will contact the ramp 120 on the stop pin 116 separating the edge 114 of the finger from the pin 116 permitting the finger to assume the finger closed position illustrated in FIG. 9b. At the same time, the cylinder 96 will be energized moving the spacer 86 between the stop collar 42 and end cap 50 to limit the downward position of the head so that the fingers are above the previously inserted sockets.

It should also be noted that the piston 104 will compress the spring 112 and contact the piston stop 110 to limit the movement of the piston 104. The piston stop 110 is threaded into threaded insert 111 and is adjustable to vary the length of travel of piston 104 and thus the location where pin 106 contacts the ramp 120 to vary the closed position of the fingers.

We claim:

1. An insertion head for inserting DIP components and sockets into a printed circuit board comprising
   a pair of finger assemblies each including a finger element,
   means for pivotally supporting said finger assemblies so that said finger elements can be pivotally advanced towards and retracted away from a gripping position,
   stop means for defining the fully advanced position of said finger assemblies, said stop means including a selectively configured locating surface,
   each of said finger assemblies further including a stop pin for engaging with said locating surface,
   means for supporting said stop pin for displacement in a direction parallel to the pivot axis of said finger assembly,
   means for maintaining said stop pin at a first position for engaging with a first portion of said locating surface for defining a first fully advanced finger position for gripping a lead of a DIP connector, and
   means for maintaining said stop pin at a second position for engaging with a second portion of said locating surface for defining a second fully advanced finger position for gripping a socket.

2. An insertion head according to claim 1, further comprising means for displacing said finger assemblies from a retracted position to a fully advanced position.

3. An insertion head according to claim 1, wherein each of said finger assemblies further includes
   a piston which supports said stop pin,
   a bore for receiving said piston,
   piston stop means for selectively limiting the displacement of said piston, and
   spring means between said piston and said piston stop means for biasing said piston toward its start position.

4. An insertion head according to claim 3, wherein said piston stop means includes a threaded insert so that the position of said piston stop means can be changed.

* * * * *